(12) United States Patent
Fairbank et al.

(10) Patent No.: US 8,064,203 B2
(45) Date of Patent: Nov. 22, 2011

(54) PROCESS FOR PREPARING CONDUCTIVE FILMS AND ARTICLES PREPARED USING THE PROCESS

(75) Inventors: Carl Fairbank, Midland, MI (US); Mark Fisher, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 12/526,561

(22) PCT Filed: Jan. 25, 2008

(86) PCT No.: PCT/US2008/000977
§ 371 (c)(1),
(2), (4) Date: Nov. 6, 2009

(87) PCT Pub. No.: WO2008/103221
PCT Pub. Date: Aug. 28, 2008

(65) Prior Publication Data
US 2010/0061063 A1 Mar. 11, 2010

Related U.S. Application Data

(60) Provisional application No. 60/902,804, filed on Feb. 22, 2007.

(51) Int. Cl.
*H05K 7/20* (2006.01)
*H01L 29/12* (2006.01)

(52) U.S. Cl. .............. 361/708; 361/679.46; 361/679.54; 361/705; 361/706; 165/104.33; 165/185; 427/122; 427/249.1; 427/212; 438/122; 438/106; 977/742; 977/750; 977/751; 257/706; 257/717; 257/720; 257/796; 428/408; 428/447; 428/401; 428/332; 428/122

(58) Field of Classification Search ............. 361/679.46, 361/679.54, 702–712; 165/80.3, 104.33, 165/185; 257/77, 706, 276, 475, 625, 675, 257/717, 720, 796; 524/86, 99, 595, 871, 524/875, 495; 977/742, 751, 750, 843, 845, 977/847, 848, 855, 856; 313/495, 309, 311, 313/346 R; 427/122, 198, 58, 97.7, 113, 427/523, 249.1, 331, 200, 264, 270, 271, 427/301, 903, 294, 307, 309; 423/447.3, 423/447.1, 447.5, 445 B, 445 R, 439, 447.2; 428/332, 323, 408, 320.2, 614, 634, 402, 428/367; 438/86, 99
See application file for complete search history.

(56) References Cited

U.S. PATENT DOCUMENTS 5,017,654 A * 5/1991 Togashi et al. ................ 525/100
(Continued)

FOREIGN PATENT DOCUMENTS

JP 2006-147801 6/2006
(Continued)

*Primary Examiner* — Michail V Datskovskiy
(74) *Attorney, Agent, or Firm* — Erika Takeuchi

(57) ABSTRACT

A free standing film includes: i. a matrix layer having opposing surfaces, and ii. an array of nanorods, where the nanorods are oriented to pass through the matrix layer and protrude an average distance of at least 1 micrometer through one or both surfaces of the matrix layer. A method for preparing the free standing film includes (a) providing an array of nanorods on a substrate, optionally (b) infiltrating the array with a sacrificial layer, (c) infiltrating the array with a matrix layer, thereby producing an infiltrated array, optionally (d) removing the sacrificial layer without removing the matrix layer, when step (b) is present, and (e) removing the infiltrated array from the substrate to form the free standing film. The free standing film is useful as an optical filter, ACF, or TIM, depending on the type and density of nanorods selected.

15 Claims, 5 Drawing Sheets

U.S. PATENT DOCUMENTS

| | | | |
|---|---|---|---|
| 5,239,035 A * | 8/1993 | Maxson | 528/15 |
| 5,912,805 A | 6/1999 | Freuler et al. | |
| 5,998,515 A * | 12/1999 | Burkus et al. | 524/86 |
| 6,040,366 A * | 3/2000 | Burkus et al. | 524/99 |
| 6,054,198 A | 4/2000 | Bunyan et al. | |
| 6,129,901 A * | 10/2000 | Moskovits et al. | 423/447.3 |
| 6,156,256 A * | 12/2000 | Kennel | 264/461 |
| 6,303,094 B1 * | 10/2001 | Kusunoki et al. | 423/447.1 |
| 6,350,488 B1 * | 2/2002 | Lee et al. | 427/249.1 |
| 6,652,958 B2 * | 11/2003 | Tobita | 428/298.1 |
| 6,695,513 B1 * | 2/2004 | Malek | 401/129 |
| 6,808,746 B1 * | 10/2004 | Dai et al. | 427/249.1 |
| 6,902,688 B2 * | 6/2005 | Narayan et al. | 252/512 |
| 6,908,572 B1 * | 6/2005 | Derbyshire et al. | 252/502 |
| 6,921,462 B2 * | 7/2005 | Montgomery et al. | 204/164 |
| 6,924,335 B2 * | 8/2005 | Fan et al. | 524/495 |
| 6,936,653 B2 * | 8/2005 | McElrath et al. | 524/496 |
| 6,947,285 B2 * | 9/2005 | Chen et al. | 361/708 |
| 7,108,841 B2 * | 9/2006 | Smalley et al. | 423/447.3 |
| 7,118,941 B2 * | 10/2006 | Zhang et al. | 438/122 |
| 7,160,620 B2 * | 1/2007 | Huang et al. | 428/408 |
| 7,253,442 B2 * | 8/2007 | Huang et al. | 257/77 |
| 7,264,990 B2 * | 9/2007 | Rueckes et al. | 438/99 |
| 7,273,095 B2 * | 9/2007 | Li et al. | 165/185 |
| 7,291,396 B2 * | 11/2007 | Huang et al. | 428/408 |
| 7,335,395 B2 * | 2/2008 | Ward et al. | 427/198 |
| 7,390,527 B2 * | 6/2008 | Hyldgaard et al. | 427/58 |
| 7,393,428 B2 * | 7/2008 | Huang et al. | 156/249 |
| 7,438,844 B2 * | 10/2008 | Huang et al. | 264/261 |
| 7,476,339 B2 * | 1/2009 | Czubarow et al. | 252/500 |
| 7,476,967 B2 * | 1/2009 | Dubin | 257/706 |
| 7,521,124 B2 * | 4/2009 | Ahn et al. | 428/447 |
| 7,560,136 B2 * | 7/2009 | Ward et al. | 427/122 |
| 7,611,651 B2 * | 11/2009 | Huang et al. | 264/134 |
| 7,641,938 B2 * | 1/2010 | Liu et al. | 427/249.1 |
| 7,666,382 B2 * | 2/2010 | Ghenciu et al. | 423/447.1 |
| 7,678,614 B2 * | 3/2010 | Huang et al. | 438/122 |
| 7,745,810 B2 * | 6/2010 | Rueckes et al. | 257/4 |
| 2001/0009693 A1 * | 7/2001 | Lee et al. | 427/249.1 |
| 2002/0172767 A1 * | 11/2002 | Grigorian et al. | 427/255.28 |
| 2003/0064169 A1 * | 4/2003 | Hong et al. | 427/569 |
| 2003/0096104 A1 * | 5/2003 | Tobita et al. | 428/332 |
| 2004/0009353 A1 * | 1/2004 | Knowles et al. | 428/411.1 |
| 2004/0038007 A1 | 2/2004 | Kotov et al. | |
| 2004/0097635 A1 * | 5/2004 | Fan et al. | 524/496 |
| 2004/0265489 A1 * | 12/2004 | Dubin | 427/212 |
| 2004/0266065 A1 * | 12/2004 | Zhang et al. | 438/122 |
| 2005/0129948 A1 * | 6/2005 | Furukawa et al. | 428/408 |
| 2005/0136248 A1 * | 6/2005 | Leu et al. | 428/332 |
| 2005/0249656 A1 * | 11/2005 | Smalley et al. | 423/447.3 |
| 2005/0255304 A1 * | 11/2005 | Brink | 428/209 |
| 2005/0269726 A1 * | 12/2005 | Matabayas, Jr. | 264/104 |
| 2006/0024499 A1 * | 2/2006 | Kim et al. | 428/401 |
| 2006/0112857 A1 | 6/2006 | Hougham et al. | |
| 2006/0231970 A1 * | 10/2006 | Huang et al. | 264/134 |
| 2006/0255450 A1 * | 11/2006 | Pan et al. | 257/712 |
| 2006/0258054 A1 * | 11/2006 | Pan et al. | 438/122 |
| 2007/0004081 A1 * | 1/2007 | Hsiao | 438/106 |
| 2007/0116626 A1 * | 5/2007 | Pan et al. | 423/447.1 |
| 2007/0116957 A1 * | 5/2007 | Pan et al. | 428/408 |
| 2007/0241303 A1 * | 10/2007 | Zhong et al. | 252/62.3 T |
| 2007/0244245 A1 * | 10/2007 | Liu et al. | 524/496 |
| 2007/0265379 A1 * | 11/2007 | Chen et al. | 524/404 |
| 2008/0128122 A1 * | 6/2008 | Huang et al. | 165/185 |

FOREIGN PATENT DOCUMENTS

| | | |
|---|---|---|
| WO | WO 98/40431 | 9/1998 |

* cited by examiner

PROCESS FOR PREPARING CONDUCTIVE FILMS AND ARTICLES PREPARED USING THE PROCESS

CROSS REFERENCE TO RELATED APPLICATIONS

This application is a U.S. national stage filing under 35 U.S.C. §371 of PCT Application No. PCT/US08/000977 filed on 25 Jan. 2008, currently pending, which claims the benefit of U.S. Provisional Patent Application No. 60/902,804 filed 22 Feb. 2007 under 35 U.S.C. §119 (e). PCT Application No. PCT/US08/000977 and U.S. Provisional Patent Application No. 60/902,804 are hereby incorporated by reference.

STATEMENT REGARDING FEDERALLY SPONSORED RESEARCH

None.

BACKGROUND OF THE INVENTION

1. Technical Field

A free standing film containing nanotubes is prepared by the process described herein. Depending on the type of nanotubes, the free standing film is useful as an optical filter, as an anisotropically electrically conductive film (ACF), or as a thermal interface material (TIM).

2. Problems to be Solved

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a thermal management aid such as a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM. The lower the thermal impedance of the TIM, the greater the flow of heat from the electronic component to the heat sink.

Surfaces of the electronic component and the heat sink are typically not completely smooth; therefore, it is difficult to achieve full contact between the surfaces. Air spaces, which are poor thermal conductors, appear between the surfaces and increase impedance. These spaces can be filled by inserting a TIM between the surfaces. As manufacturers make smaller and smaller devices, there is a continuing need for TIMs which are thin and have improved thermal conductivity to efficiently transfer heat from electronic components to thermal management aids.

Composites containing nanotubes randomly distributed in a matrix are known for use as TIMs in the art. However, when nanotubes are oriented in an array instead of being randomly distributed, the array may exhibit improved properties, such as thermal conductivity. It is difficult to produce TIMs containing such arrays.

BRIEF SUMMARY OF THE INVENTION

A method is useful for fabricating a free standing film having nanorods protruding through a matrix layer. The method comprises:

(a) providing an array of nanorods on a substrate, optionally (b) infiltrating the array with a sacrificial layer, (c) infiltrating the array with a matrix layer, thereby producing an infiltrated array, optionally (d) removing the sacrificial layer without removing the matrix layer, when step (b) is present, and (e) removing the infiltrated array from the substrate to form a free standing film, where the matrix layer has opposing surfaces, and the nanorods are oriented to pass through the matrix layer and protrude a distance at least 1 micrometer through one or both of the opposing surfaces of the matrix layer.

DETAILED DESCRIPTION OF THE INVENTION

Definitions and Usage of Terms

Figure 1A:
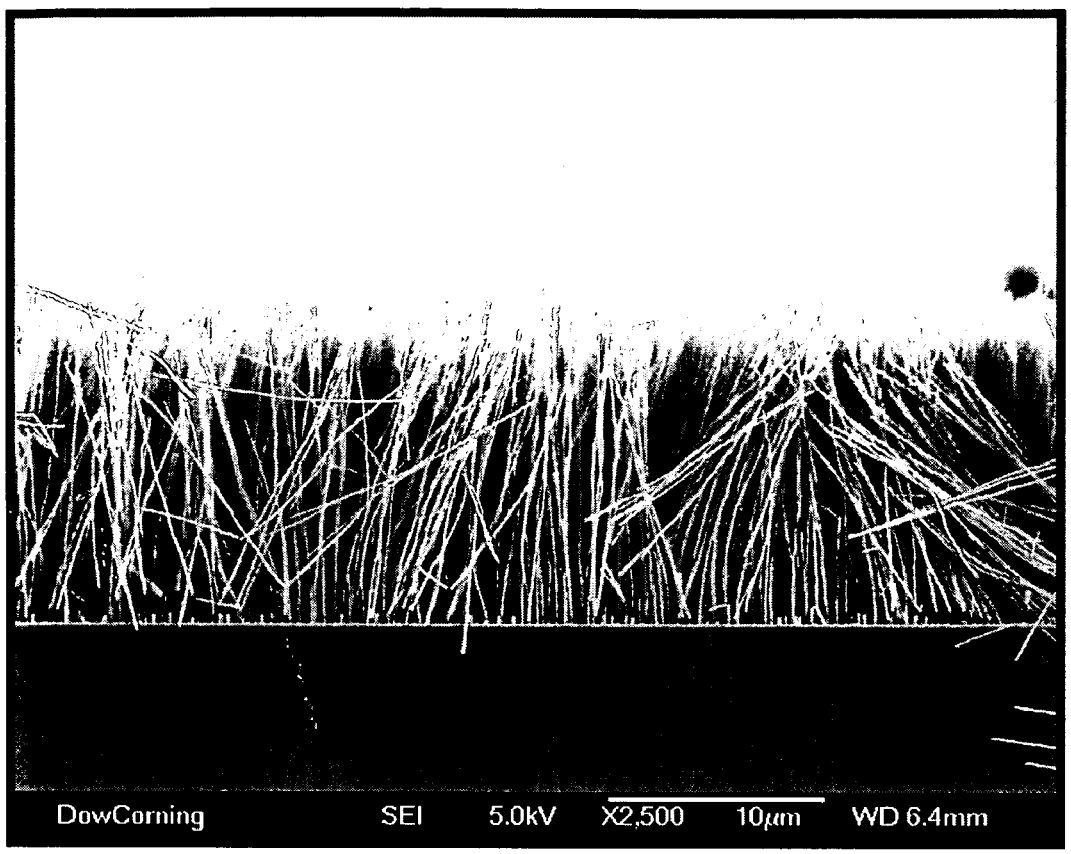
FIG. 1a shows an array of MWNT on a silicon wafer. This array is used in example 1.

All amounts, ratios, and percentages are by weight unless otherwise indicated. For purposes of this application, the articles "a", "an", and "the" each refer to one or more. In the formulae herein, "Et" represents an ethyl group, "Me" represents a methyl group, "Ph" represents a phenyl group, and "Vi" represents a vinyl group. "MWNT" means multi-walled carbon nanotubes. "SWNT" means single-walled carbon nanotubes. "TEOS" means tetraethoxysilane.

"Nanorod" means a thermally conductive structure having a width no greater than 0.5 micrometers and an aspect ratio greater than 10, alternatively greater than 100. The nanorods may be hollow nanotubes. Nanorods may be cylindrical in shape, where the width (diameter) is no greater than 0.5 micrometers. Alternatively, nanorods may have different shapes. The term nanorods includes, but is not limited to, single walled carbon nanotubes, MWNT, and boron nitride nanotubes.

"Array of nanorods" means that a plurality of the nanorods present are aligned with a substantial number oriented at an angle intersecting the surface of a planar substrate and parallel to each other. An array of MWNT is exemplified by that shown in FIG. 1a.

"Sacrificial layer" means any film forming material that can be removed selectively without removing the matrix layer and without removing the nanorods from the matrix.

Method

A method is useful for fabricating a free standing film having nanorods protruding through a matrix layer. The method comprises:
(a) providing an array of nanorods on a planar substrate,
optionally (b) infiltrating the array with a sacrificial layer,
(c) infiltrating the array with a matrix layer, thereby producing an infiltrated array,
optionally (d) removing the sacrificial layer without removing the matrix layer, when step (b) is present, and
(e) removing the infiltrated array from the planar substrate to form a free standing film, where the matrix layer has opposing surfaces, and the nanorods are oriented to pass through the matrix layer and protrude a distance at least 1 micrometer through one or both of the opposing surfaces of the matrix layer.

The matrix layer may or may not be at the center of the nanorods. One or more matrix layers may be infiltrated in the method. A second matrix layer may be added at various times in the method. For example, when step (d) is present, the method may optionally further comprise infiltrating the array with a second matrix layer before, during, or after, step (d). The space left by removing the sacrificial layer may be infiltrated with the second matrix layer.

The array of nanorods may be provided by a plasma enhanced chemical vapor deposition growth process. The array of nanorods may optionally be subjected to a graphitization step before step (a). Without wishing to be bound by theory, it is thought than when carbon nanotubes are used to form the array, the graphitization step enhances thermal conductivity of the free standing film prepared by the method described herein. Arrays of nanorods on planar substrates are known in the art and are commercially available from Nano-Lab, 55 Chapel Street, Newton, Mass. 02458.

Steps (b) and (d) may be included in the method to provide a free standing film having nanotubes protruding beyond both opposing surfaces of a matrix layer. The sacrificial layer used in step (b) may be thermoplastic, such as a high viscosity noncuring silicone fluid or silicone gum, a fluorosilicone, a photo definable silicone, silica, or a wax. Step (b) may be performed by any convenient means, and the exact means will depend on the type of sacrificial layer selected. For example, when the sacrificial layer is silica, the sacrificial layer may be formed by coating a layer of silica from a sol gel solution.

Step (d) may be present when step (b) is present. Step (d) may be performed by any convenient means, and the exact means depends on the type of sacrificial layer selected. For example, when the sacrificial layer is a wax, it may be removed by heating. When the sacrificial layer is silica and the sacrificial layer is formed by coating a layer of silica from a sol gel solution, step (d) is performed by exposure to a solution comprising HF. Steps (d) and (e) may be performed sequentially or concurrently. For example, when the sacrificial layer is silica and step (d) is performed by exposure to a solution comprising HF, steps (d) and (e) are performed concurrently. The method may optionally further comprise step (f) washing the free standing film after step (e). Step (f) may be used to remove residual HF or residual portions of the sacrificial layer, or both.

Alternatively, step (b) may be present and step (d) may not be present. For example, this method may be used to prepare a free standing film having a wax infiltrated in step (b). When step (d) is not present, the wax may then act as a phase change layer in the free standing film.

Step (c) may be performed by any convenient means, and the exact means depends on the type of the matrix layer selected. For example, step (c) may be performed by a method selected from the group consisting of spin coating, dip coating, spray coating, and solvent casting. The matrix layer may comprise a thermosetting polymer. Examples of suitable thermosetting polymers include epoxy resins, cyanate resins, bismaleimide resins, phenolic resins, polyester resins, silicone elastomers, urethane elastomers, acrylic elastomers, and combinations thereof. When a silicone elastomer is used as the matrix layer, the silicone elastomer may be prepared by infiltrating the array with a composition comprising A) a polyorganosiloxane having an average of at least two aliphatically unsaturated organic groups per molecule, B) a crosslinker having an average of at least two silicon bonded hydrogen atoms per molecule, and C) a hydrosilylation catalyst and curing the composition to form the silicone elastomer before step (d) or step (e).

Alternatively, the matrix layer may comprise a thermoplastic polymer. Examples of suitable thermoplastic polymers include polyamide, polyimide, polyphenylene, polycarbonate, polyacetal, polypropylene, polyethylene glycol, polyoxymethylene, polyformaldehyde, silicone amide copolymer, silicone polyether, silicone polyetherimide copolymer, silicone urethane copolymer, silicone urea, and combinations thereof.

The matrix layer may optionally comprise a filler, when the array of nanorods has a relatively low density. The filler must have a particle size small enough not to inhibit infiltration of the matrix in the array of nanorods. The filler may be a thermally conductive filler. Examples of suitable thermally conductive fillers include copper, boron nitride, alumina, aluminum nitride, zinc oxide, silver, aluminum, and combinations thereof.

Free Standing Film

The product of the process described above is a free standing film comprising:
i. a matrix layer having opposing surfaces, and
ii. an array of nanorods, where the nanorods are oriented to pass through the matrix layer and protrude a distance at least 1 micrometer through one or both surfaces of the matrix layer.

The array may have a density of nanorods ranging from 0.5 vol % to 50 vol %. The exact density depends on the method used to provide the array and the end use of the free standing film. For example, an ACF can have lower density of nanorods, e.g., 0.1 vol % to 10 vol %. To improve thermal conductivity when thermally conductive nanorods are used, density may range from 5 vol % to 50 vol %.

The nanorods used herein may be nanotubes. The nanorods selected may be thermally conductive and electrically insulating. Examples of suitable nanorods include MWNT and single-walled carbon nanotubes. Alternatively, the nanorods selected may be both electrically conductive and thermally conductive. Examples of suitable nanorods include boron nitride nanotubes.

The nanorods may have an average height ranging from 5 to 500 micrometers. The nanorods are oriented to pass through the matrix layer and protrude an average distance of at least 1 micrometer through one or both of the opposing surfaces of the matrix layer. Alternatively, the nanorods may protrude an average distance ranging from 1 micrometer to 0.8 millimeter through the one or both opposing surfaces of the matrix layer.

Uses of the Free Standing Film

The free standing film may be used in various applications. Depending on the type of nanotubes, the free standing film is useful as an optical filter, as an ACF, or as a TIM. When the free standing film will be used as a TIM, the free standing film may be used in a device comprising:
a) a heat generating component,
b) a thermal interface material, and
c) a thermal management aid;
where the thermal interface material is interposed between the heat generating component and the thermal management aid along a thermal path extending from a surface of the heat generating component to a surface of the thermal management aid, where the thermal interface material comprises the free standing film described above and the nanorods contact a surface of the heat generating component and a surface of the thermal management aid.

Figure 2:
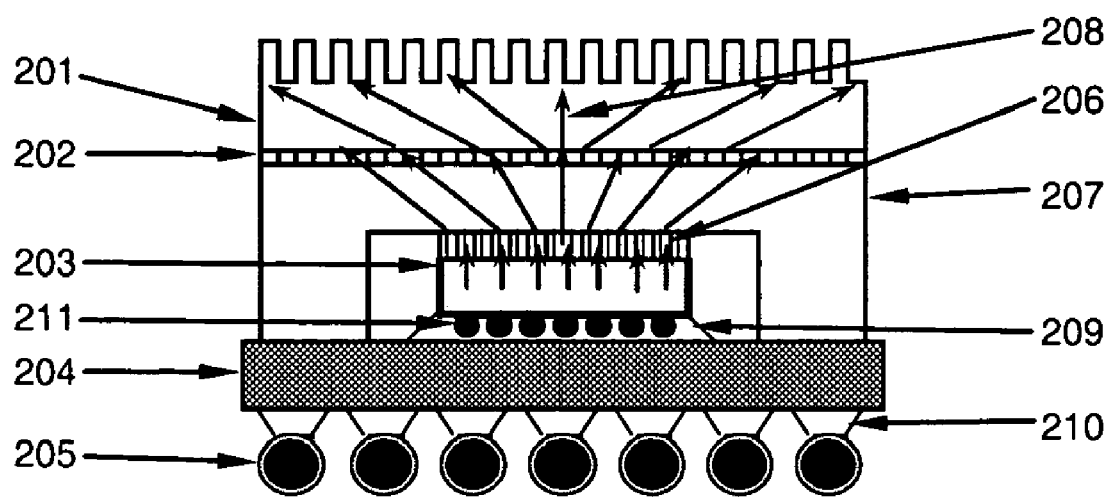
FIG. 2 shows a cross section of a portion of an electronic device including a free standing film described herein.

FIG. 2 shows a cross section of a portion of an electronic device 200. The device 200 includes a heat generating component (shown as an IC chip) 203, a first thermal interface material (TIM1) 206, which is a free standing film having MWNT protruding through a matrix layer as described above, and a thermal management aid (shown as a metal cover) 207. The TIM1 206 is interposed between the heat generating component 203 and the thermal management aid 207 along a thermal path represented by arrows 208 extending from a surface of the heat generating component 203 to a surface of the thermal management aid 207. The nanotubes contact a surface of the heat generating component 203 and a surface of the thermal management aid 207 to facilitate heat transfer when the device 200 operates. The heat generating component 203 is mounted to a substrate 204 through a die attach adhesive 209. The substrate 204 has solder balls 205 attached thereto through pads 210. A second interface material (TIM2) 202 is interposed between the thermal management aid 207 and a heat sink 201. Heat moves along a thermal path represented by arrows 208 when the device is operated.

The free standing film may be used in a method for fabricating an electronic device. The method comprises interposing a thermal interface material between a heat generating component and a thermal management aid. The thermal interface material is interposed along a thermal path extending from a surface of the heat generating component to a surface of the thermal management aid. The thermal interface material comprises the free standing film described above, and the nanorods contact a surface of the heat generating component and a surface of the thermal management aid. The heat generating component may comprise a semiconductor die and the thermal management aid may comprise a heat sink or a heat spreader.

Devices may be prepared including the free standing film described above. For example, the free standing film described above may be used as or in the thermal interface materials in the devices disclosed in, for example, U.S. Pat. Nos. 5,912,805 and 6,054,198 in addition to, or instead of, the interface materials described therein.

EXAMPLES

These examples are intended to illustrate the invention to one skilled in the art and should not be interpreted as limiting the scope of the invention set forth in the claims.

Example 1

Free Standing Film Prepared with No Sacrificial Layer

A sufficient amount of solution (0.5 to 1 mL) containing 20% by weight of a curable silicone elastomer composition (DOW CORNING® Sylgard 184, which is commercially available from Dow Corning Corporation of Midland, Mich., U.S.A.) dissolved in chloroform was dispensed on top of a 2×2 cm silicon wafer with an array of MWNT thereon. The MWNT had an average height of 18 micrometers+/−2 micrometers, average diameter of 0.1 micrometers, and have a density covering 6 to 10 area % of the surface of the wafer, as shown in FIG. 1a. The array of nanotubes was suitable for release from the wafer by mild mechanical force.

Figure 1B:
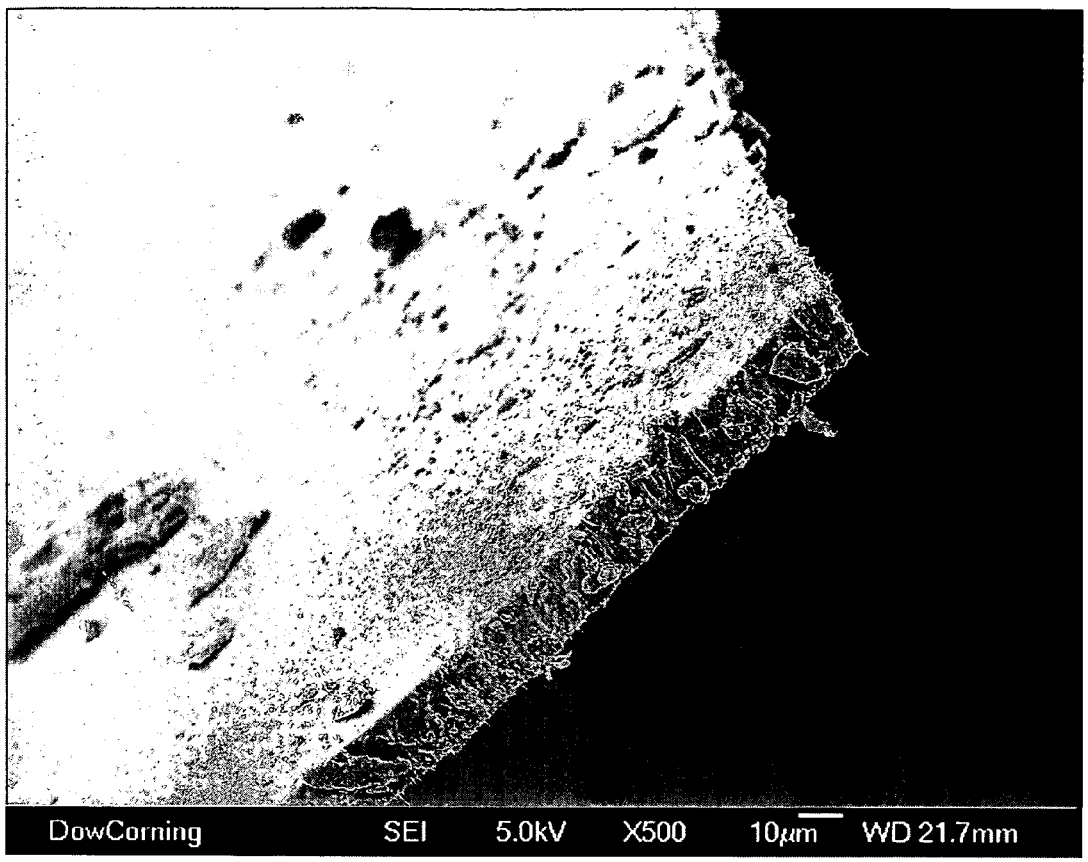
FIGS. 1b and 1c show cross sections of a free standing film prepared in example 1 at different magnifications. The film includes a matrix layer having an array of MWNT protruding through a surface of the matrix.
Figure 1C:
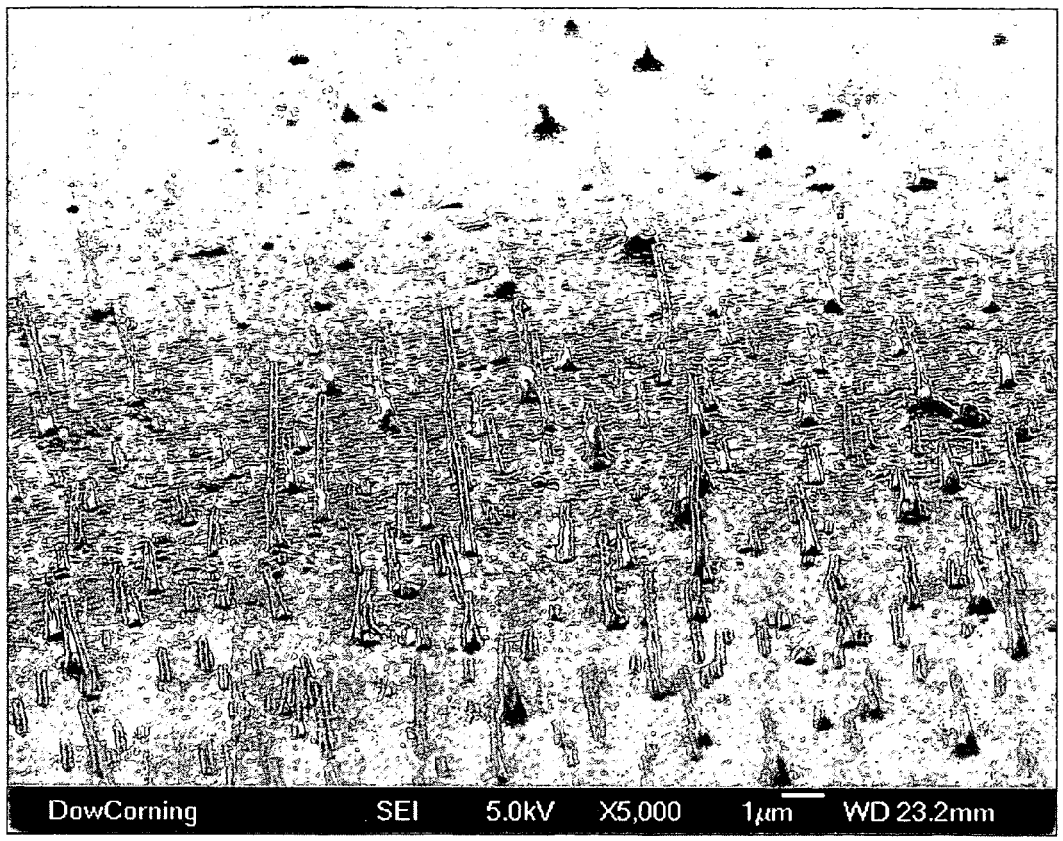

Next, the wafer and solution were spun at 1000 rpm, for 30 s using a Chemat Spin Coater KW-4A. After spinning, the wafer was allowed to stand for 15 minutes, then it was placed in a 150° C. oven for 1 hour to cure the silicone elastomer matrix layer. After cooling, the wafer was immersed in a 35 vol % solution of HF and deionized water, and after 10 minutes, a free standing film floated away from the wafer. The free standing film is shown in FIGS. 1b and 1c at different magnifications. The free standing film was removed and subjected to a washing step to remove residual HF solution.

Example 2

Free Standing Film Prepared with a Sacrificial Layer

Figure 1D:
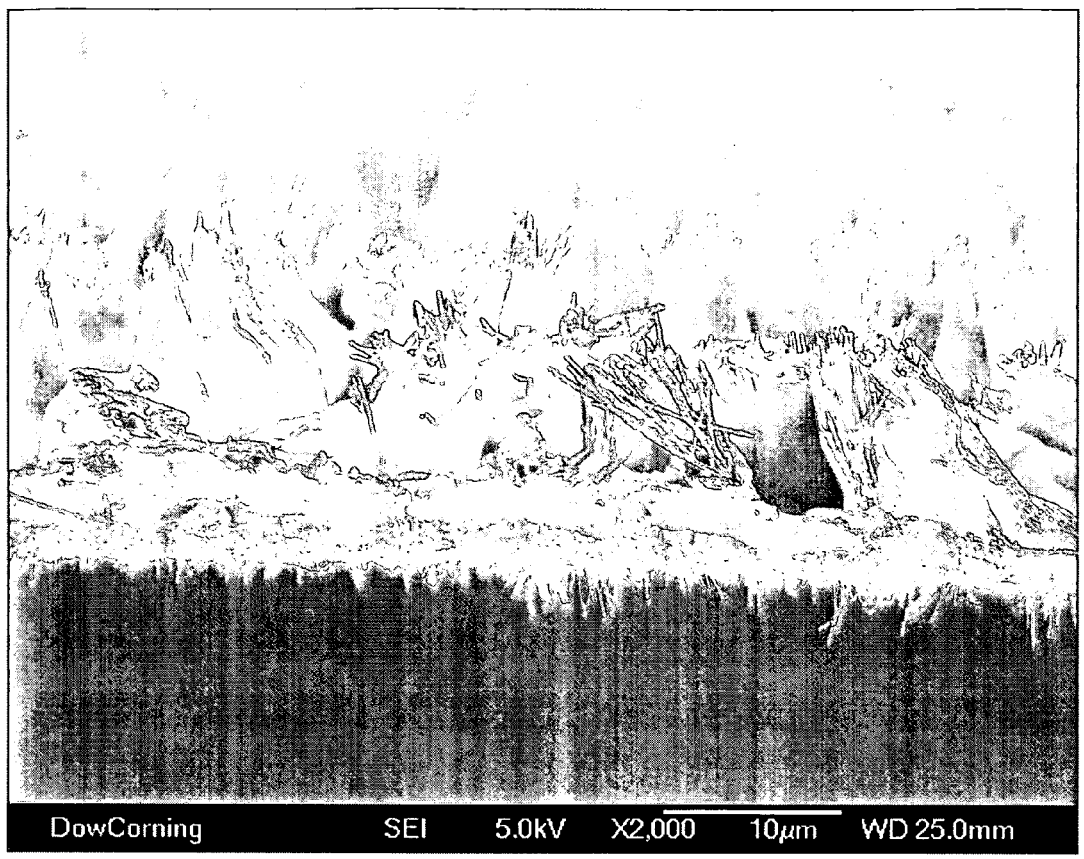
FIG. 1d shows a cross section of a free standing film prepared in example 2.

A sufficient amount of a solution containing 5% solids silica sol gel solution (TEOS/HCl/Ethanol/$H_2O$) solution was dispensed onto a 2×2 cm MWNT coated silicon wafer substrate. The solution and substrate were spun at 2000 rpm for 30 seconds using a Chemat Spin Coater KW-4A. The wafer was allowed to stand in ambient conditions (20° C., 35% RH) for 30 minutes, and then was cured by heating for 30 minutes at 50° C., followed by 15 minutes at 150° C. Next, a sufficient portion of a 11 wt % silicone polyetherimide copolymer (Gelest SSP-085) in toluene solution was placed on the MWNT array, and the solution and wafer were spun at 1000 rpm for 30 seconds. The wafer was allowed to stand for 15 minutes at room temperature follow by 15 minutes at 100° C. to remove the toluene. After cooling, the wafer was immersed in a 35 vol % solution of HF and deionized water. After approximately 20 minutes, a free standing film floated away from the wafer as shown in FIG. 1d. The film was removed and subjected to a washing step to remove residual HF solution.

INDUSTRIAL APPLICABILITY

The free standing film prepared by the method described herein is useful as an optical filter, as an ACF, or as a TIM. Without wishing to be bound by theory, it is thought that improved thermal conductivity can be achieved when carbon nanotubes, particularly MWNT, are used in the array.

The invention claimed is:
1. A method for preparing conductive films comprising:
(a) providing an array of nanorods on a substrate,
(b) infiltrating the array with a sacrificial layer selected from a high viscosity noncuring silicone fluid, silicone gum, a fluorosilicone, a photo definable silicone, silica, or a wax,
(c) infiltrating the array with a matrix layer, thereby producing an infiltrated array,
(d) removing the sacrificial layer without removing the matrix layer, and
(e) removing the infiltrated array from the substrate to form a free standing film, where the matrix layer has opposing surfaces, and the nanorods are oriented to pass through the matrix layer and protrude an average distance at least 1 micrometer through one or both of the opposing surfaces of the matrix layer.

2. The method of claim 1, where step (d) is present and the method further comprises infiltrating the array with a second matrix layer before, during, or after, step (d).

3. The method of claim 1, where the nanorods protrude a distance ranging from 1 micrometer to 0.8 millimeter through the one or both opposing surfaces.

4. The method of claim 1, where the array has a density ranging from 0.1 vol % to 50 vol %.

5. The method of claim 1, where the nanorods have an average height ranging from 5 to 500 micrometers.

6. The method of claim 1, where the nanorods are boron nitride nanotubes.

7. The method of claim 1, where the nanorods are selected from the group consisting of multi-walled carbon nanotubes and single-walled carbon nanotubes.

8. The method of claim 7, where the array of nanorods is provided by a plasma enhanced chemical vapor deposition growth process.

9. The method of claim 8, where the array of nanorods is subject to a graphitization step before step (a).

10. The method of claim 1, where the matrix comprises a thermosetting polymer.

11. The method of claim 10, where the thermosetting polymer is selected from the group consisting of epoxy resins, cyanate resins, bismaleimide resins, phenolic resins, polyester resins, silicone elastomers, urethane elastomers, acrylic elastomers, and combinations thereof.

12. The method of claim 10, where the thermosetting polymer comprises a composition comprising:
  A) a polyorganosiloxane having an average of at least two aliphatically unsaturated organic groups per molecule,
  B) a crosslinker having an average of at least two silicon bonded hydrogen atoms per molecule, and
  C) a hydrosilylation catalyst.

13. The method of claim 1, where the matrix comprises a thermoplastic polymer.

14. The method of claim 10, where the matrix further comprises a filler.

15. The method of claim 14, where the filler is thermally conductive.

* * * * *